(12) United States Patent
Alapati et al.

(10) Patent No.: US 12,087,623 B1
(45) Date of Patent: Sep. 10, 2024

(54) DIELECTRIC LINERS ON THROUGH GLASS VIAS

(71) Applicant: Yield Engineering Systems, Inc., Fremont, CA (US)

(72) Inventors: Ramakanth Alapati, Dallas, TX (US); M Ziaul Karim, San Jose, CA (US); Christopher Lane, Los Gatos, CA (US)

(73) Assignee: YIELD ENGINEERING SYSTEMS, INC., Fremont, CA (US)

( * ) Notice: Subject to any disclaimer, the term of this patent is extended or adjusted under 35 U.S.C. 154(b) by 0 days.

(21) Appl. No.: 18/422,346

(22) Filed: Jan. 25, 2024

(51) Int. Cl.
| | |
|---|---|
| H01L 21/768 | (2006.01) |
| H01L 23/15 | (2006.01) |
| H01L 23/498 | (2006.01) |
| H01L 23/522 | (2006.01) |
| H01L 23/532 | (2006.01) |
| H01L 23/538 | (2006.01) |

(52) U.S. Cl.
CPC .. H01L 21/76831 (2013.01); H01L 21/76822 (2013.01); H01L 23/49894 (2013.01); H01L 23/5329 (2013.01); *H01L 23/15* (2013.01); *H01L 23/49822* (2013.01); *H01L 23/49827* (2013.01); *H01L 23/5226* (2013.01); *H01L 23/5384* (2013.01)

(58) Field of Classification Search
CPC ......... H01L 21/76831; H01L 21/76828; H01L 21/76829; H01L 21/76841; H01L 21/76843; H01L 21/486; H01L 21/481; H01L 23/15; H01L 23/5384; H01L 23/5329; H01L 23/5226; H01L 23/49827; H01L 23/49822; H01L 2224/05087; H05K 3/4061; H05K 3/4038; H05K 1/0306

See application file for complete search history.

(56) References Cited

U.S. PATENT DOCUMENTS

| | | | |
|---|---|---|---|
| 7,256,146 B2 * | 8/2007 | Cohen | H01L 21/3122 438/782 |
| 7,964,965 B2 * | 6/2011 | Lee | H01L 21/02118 438/618 |
| 8,148,263 B2 * | 4/2012 | Sinha | H01L 23/49827 257/E21.597 |
| 8,155,292 B2 * | 4/2012 | Takahashi | H04M 3/5183 379/225 |
| 9,478,504 B1 * | 10/2016 | Shen | H01L 23/49838 |
| 9,596,768 B2 * | 3/2017 | We | H05K 1/0306 |
| 11,282,777 B2 * | 3/2022 | Yen | H01L 24/08 |

* cited by examiner

*Primary Examiner* — David A Zarneke
(74) *Attorney, Agent, or Firm* — Finnegan, Henderson, Farabow, Garrett & Dunner, LLP

(57) ABSTRACT

A method of improving interfacial adhesion of a copper-glass interface in a Through Glass Via (TGV) of an electronic device includes coating an internal wall of a TGV with a curable polymer material having a viscosity less than 30 Poise. The coating is cured to form a dielectric liner having a tensile strength greater than about 8 Mpa and a dielectric loss less than about 0.002. A layer of copper may then be deposited on the dielectric liner.

18 Claims, 6 Drawing Sheets

DIELECTRIC LINERS ON THROUGH GLASS VIAS

TECHNICAL FIELD

The present disclosure relates to apparatuses and methods for coating a dielectric liner on the walls of Through Glass Vias in semiconductor packages.

BACKGROUND

In the context of a semiconductor package, a "via" on a glass substrate refers to a hole or opening that allows electrical connections to be made between different layers of the glass interposer or substrate. Vias are used to establish connections between different conductive layers within the substrate or to connect the substrate to other components in the electronic package. These connections facilitate the flow of electrical signals between different parts of the electronic device, enabling proper functionality. There are different types of vias, including plated through-hole vias and microvias in a typical substrate used in an electronic package. Plated through-hole vias extend through the entire thickness of the substrate, connecting conductive traces on both sides of the substrate. Microvias, on the other hand, are smaller and used in high-density applications where space is limited. Glass substrates or substrates with glass cores are used in electronic packaging, especially in applications like integrated circuits (ICs) and microelectronics. Through-hole vias through a glass substrate or the glass core of a substrate are referred to as Through-Glass Vias (TGVs). In semiconductor technology, glass substrates or cores with TGVs are used as an alternative to traditional organic, ceramic, or silicon substrates and substrate cores. Glass offers advantages such as improved thermal performance, better electrical insulation, and the ability to integrate passive components. Overall, glass substrates or cores with TGVs are part of the ongoing effort in the semiconductor industry to develop advanced packaging solutions that can enhance the performance, miniaturization, and functionality of electronic devices.

Utilization of glass substrates or cores in semiconductor applications involve several challenges. For example, thermo-mechanical stresses arising from differences in the coefficient of thermal expansion (CTE) between the glass and copper may result in delamination and cracking of the thin film layers and/or the glass. In some cases, copper migration into glass also may also create issues. The methods and devices of the current disclosure may alleviate at least some of the above-described issues. However, the scope of the current disclosure is defined by the claims and not by the ability to solve any problem.

SUMMARY

Disclosed are apparatuses and methods to improve adhesion, or reduce delamination, of copper-glass interfaces of an electronic package. An exemplary method utilizes an interfacial dielectric liner between glass and copper metallization in, for example, Through Glass Vias (TGVs), of a substrate to reduce delamination and thereby improve the reliability of the multi-layer structure. Embodiments of an apparatus to form the interfacial dielectric layer are also disclosed.

In one embodiments, a method of improving interfacial adhesion of a copper-glass interface in a Through Glass Via (TGV) of an electronic device is disclosed. The method may include providing a glass substrate with a plurality of TGVs formed thereon. The method may also include forming a coating of a curable polymer material on an internal wall of a TGV of the plurality of TGVs. A viscosity of the curable polymer material may be less than 30 Poise. The method may further include curing the coating of the curable polymer material to form a dielectric liner having a tensile strength greater than about 8 Mpa and a dielectric loss less than about 0.002. The method may further include depositing a layer of copper on the dielectric liner.

In another embodiment, a method of improving interfacial adhesion of a copper-glass interface in a Through Glass Via (TGV) of an electronic device is disclosed. The method may include providing a glass substrate with a plurality of TGVs formed thereon. The method may also include forming a coating of a curable polymer material on a surface of the glass substrate and an internal wall of a TGV of the plurality of TGVs. The curable polymer material may be one of (i) polyamide HD-2610, (ii) polyamide HD-2611, (ii) Durimide series, (iv) BSI.T1802, or (v) BSI.T15140G. The method may also include curing the coating of the curable polymer material to form a dielectric liner having a tensile strength greater than about 8 Mpa. The method may further include depositing a layer of copper on the dielectric liner.

In yet another embodiment, An electronic device is disclosed. The device may include a substrate including a glass core. The glass core may include a plurality of Through Glass Vias (TGVs) extending therethrough. A dielectric liner may be disposed on an internal wall of a TGV of the plurality of TGVs. The dielectric liner may be a cured polymer having a viscosity less than about 30 Poise. The polymer may be one of (i) polyamide HD-2610, (ii) polyamide HD-2611, (ii) Durimide series, (iv) BSI.T1802, or (v) BSI.T15140G. And, a layer of copper is disposed on the dielectric liner.

BRIEF DESCRIPTION OF THE DRAWINGS

The accompanying drawings, which are incorporated herein and constitute a part of this disclosure, illustrate exemplary embodiments and, together with the description, are used to explain the disclosed principles. In these drawings, where appropriate, reference numerals that illustrate the same or similar structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure of the various described embodiments. Details of well-known components or features may be omitted to avoid obscuring other features, since these omitted features are well-known to those of ordinary skill in the art. Further, features in the figures are not necessarily drawn to scale. The dimensions of some features may be exaggerated relative to other features to improve understanding of the exemplary embodiments. One skilled in the art would appreciate that the features in the figures are not necessarily drawn to scale and, unless indicated otherwise, should not be viewed as representing dimensions or proportional relationships between different features in a figure. Additionally, even if it is not expressly mentioned, aspects described with reference to one embodiment or figure may also be applicable to, and may be used with, other embodiments or figures.

DETAILED DESCRIPTION

All relative terms such as "about," "substantially," "approximately," etc., indicate a possible variation of ±10% (unless noted otherwise or another degree of variation is specified). For example, a feature disclosed as being about "t" units thick (or length, width, depth, etc.) may vary in thickness from (t−0.1t) to (t+0.1t) units. In some cases, the specification also provides context to some of the relative terms used. For example, a structure (e.g., a coating edge) described as being substantially flat may deviate by +10% from being perfectly flat. Further, a range described as varying from, or between, 5 to 10 (5-10), includes the endpoints (i.e., 5 and 10). Moreover, as used herein, a composition that includes at least one of A, B, or C is used to refer to a composition that includes one or more of A, B, or C. For example, a composition that includes only A, a composition that includes only B, a composition that includes only C, a composition that includes both A and B, a composition that includes both A and C, a composition that includes A, B, and C, etc.

Unless otherwise defined, all terms of art, notations, and other scientific terms or terminology used herein have the same meaning as commonly understood by persons of ordinary skill in the art to which this disclosure belongs. Some components, structures, and/or processes described or referenced herein are well understood and commonly employed using conventional methodology by those skilled in the art. These components, structures, and processes will not be described in detail. All patents, applications, published applications and other publications referred to herein as being incorporated by reference are incorporated by reference in their entirety. If a definition or description set forth in this disclosure is contrary to, or otherwise inconsistent with, a definition and/or description in these references, the definition and/or description set forth in this disclosure controls over those in references incorporated by reference. None of the references described or referenced herein is admitted as prior art relative to the current disclosure. It should be noted that, in this disclosure, the term "electronic device" is used to cover all components and electronic/photonic assemblies (e.g., package substrate, printed circuit board, interposer, integrated circuit chip, etc.). The discussion below describes an exemplary method to improve the interfacial adhesion strength (e.g., reduce delamination) and reliability of a glass-copper interface in TGVs of a glass substrate.

Figure 1A:
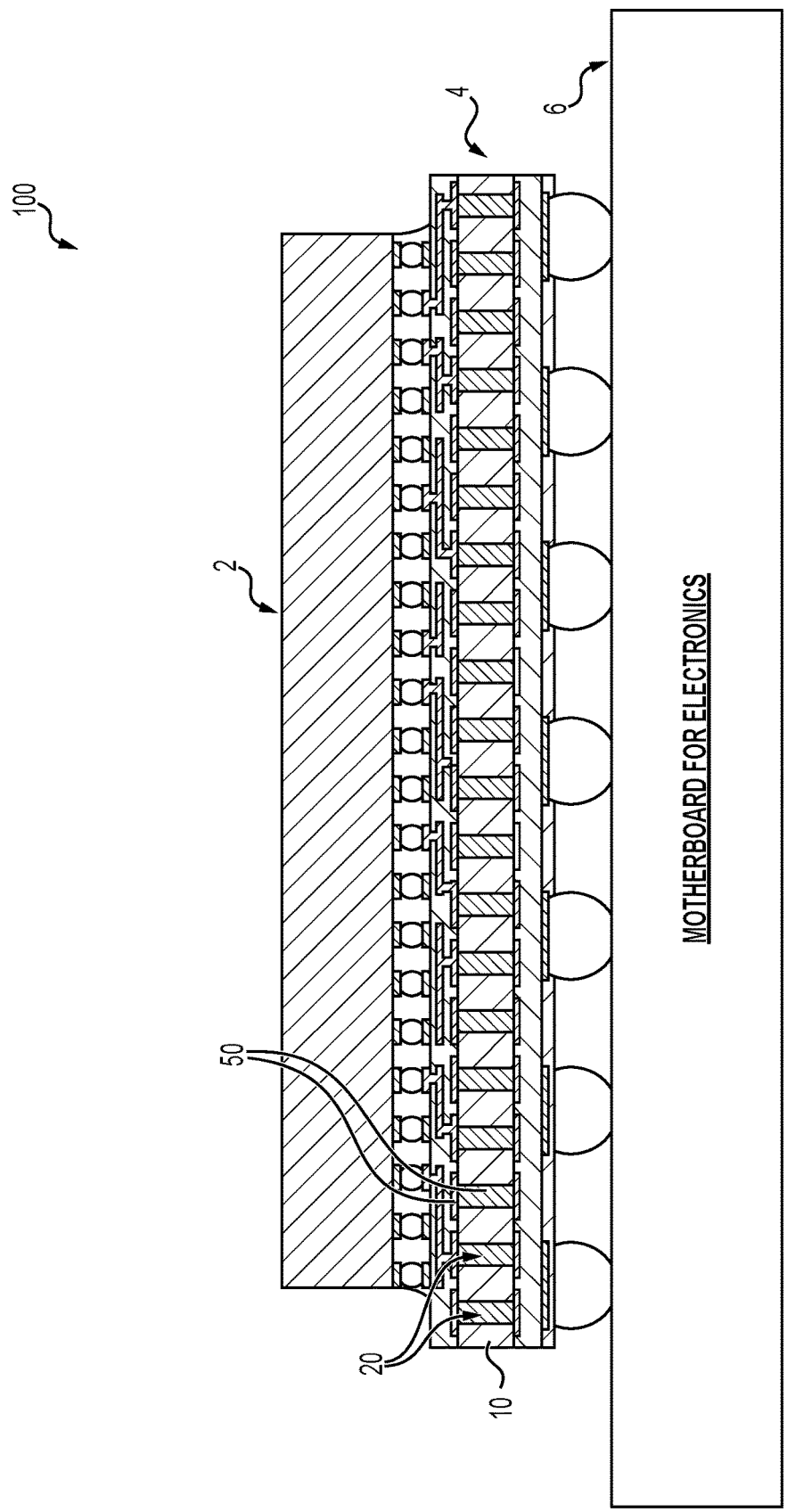
FIG. 1A illustrates an exemplary electronic device of the current disclosure.
Figure 1B:
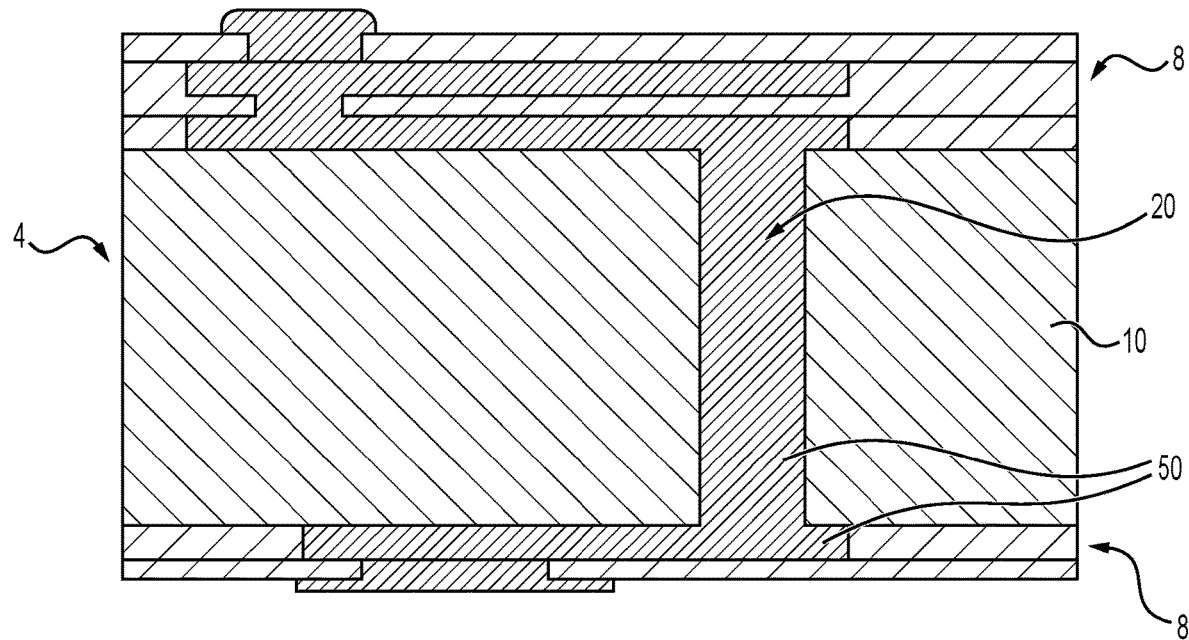
FIG. 1B illustrates a Through Glass Via (TGV) extending through the glass core of the electronic device FIG. 1A.
Figure 1C:
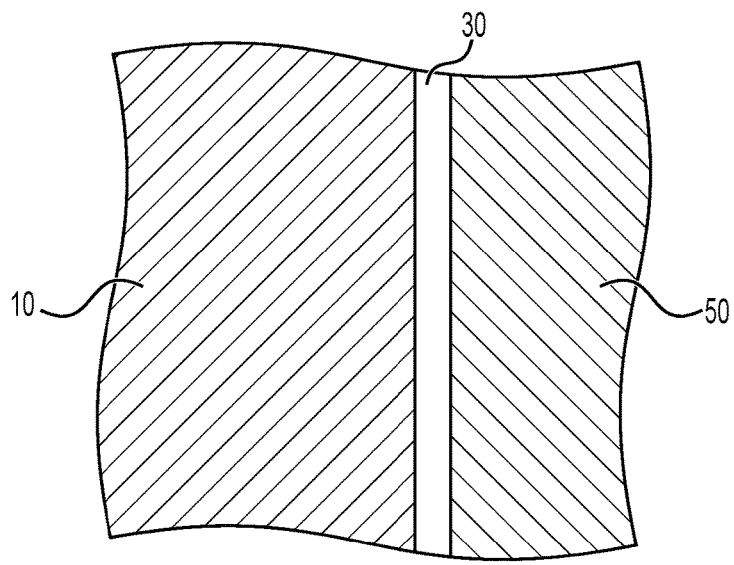
FIG. 1C illustrates a copper-glass interface with an interfacial dielectric liner in the internal wall of the TGV of FIG. 1B.

In the context of an electronic package, the terms substrate and interposer refer to base or support material that provide a foundation for the various components and interconnections in an electronic device. They serve as a platform on which circuits, integrated circuits, and other electronic components are formed and/or mounted. FIG. 1A illustrates an exemplary electronic device 100. Device 100 includes a semiconductor device 2 attached on a substrate 4 which is mounted to an interposer 6. FIG. 1B shows an enlarged view of the circled region in FIG. 1A, and FIG. 1C shows a further enlarged view of the circled region in FIG. 1B. In the discussion below, reference may be made to FIGS. 1A-1C. Substrate 4 may include a glass core 10 with TGVs 20 extending therethrough. As best seen in FIG. 1B, substrate 4 may include multiple build-up layers 8 with metallization 50 (traces, microvia, etc.) on opposite sides of the glass core 10. TGVs 50 extending through core 10 may provide electrical connection between the metallization on opposite sides of core 10. The build-up layers 8 may typically be formed of any dielectric material (e.g., organic materials, etc.). It should be noted that although substrate 4 is described as having a glass core 10, this is only exemplary. In some embodiments, substrate 4 and/or interposer 6 may be made of glass and the TGVs may connect metallization (and/or IC devices) on opposite sides of the glass substrate or interposer. In the discussion below, the terms core with TGVs, substrate with TGVs, and interposer with TGVs may be used interchangeably.

Core 10 may have any size (e.g., thickness). In some embodiments, core 10 may have a thickness between about 200 microns to 4 mm. The specific composition of glass in core 10 can vary depending on the application. In general, core 10 may made of glass doped with one or more constituents (e.g., doped glass) to impart desirable properties for an expected application. In some embodiments, core 10 may be made of borosilicate glass. Core 10 may include a plurality of TGVs 20 extending therethrough (e.g., vertically therethrough). Although not a requirement, in some embodiments, core 10 may include several thousands or millions of TGVs 20. TGVs 20 may be formed in core 10 in any known manner (e.g., wet etching (using, for example, NaOH, KOH, fluorine containing acid, etc.), precision drilling, laser ablation techniques, etc.). TGVs 10 may provide vertical electrical connection through the glass core 10. For example, a TGV may be used to provide a continuous electrical path from the metallization on one side of the core to the metallization on the opposite side. TGVs 20 may have different sizes (e.g., diameters) and shapes (e.g., aspect ratio, taper angle, etc.). Typically, the diameter of a TGV 20 depends, among other factors, on the intended application of substrate 4 and the manufacturing process used to form TGVs 20. In general, the diameter of a TGV 20 can range from a few microns to several tens of microns (e.g., 5 microns-100 microns). Aspect ratio is the ratio of the diameter to the depth of the via and taper angle is the angle of the internal side walls of TGV 20. Although not a requirement, in some embodiments, all TGVs 20 in substrate 4 may have the same size (e.g., about 50 microns diameter).

Metallization 50 (e.g., line, plane, pad, via wall, etc. formed of copper) is formed on opposite sides of core 10 and may fill the TGVs that extend through core 10. In this disclosure, metallization 50 refers to any electrically conductive feature (lines, vias, planes, pads, etc.) formed on substrate 4 to create an electrically conductive pathway.

Although any suitable electrically conductive material may be used to form metallization 50, copper is a widely used material due to its excellent electrical conductivity. To form metallization 50, the surface(s) of substrate 4 may be first prepared by cleaning. In embodiments of the current disclosure, as best seen in FIG. 1C, a thin dielectric layer may then be provided as a liner 30 on the glass surfaces (or core 10) to reduce or mitigate the CTE mismatch induced delamination and/or cracking of the copper metallization 50 that will be formed on core 10. Thus, in embodiments of the current disclosure, a dielectric liner 30 is formed and disposed at the interface between the glass core 10 and the copper metallization 50. After forming liner 30, a layer of copper may be deposited (or otherwise formed) atop dielectric liner 30. Any known process (e.g., physical vapor deposition (PVD), chemical vapor deposition, electroless plating, electroplating, etc.) may be used to deposit the copper layer. Typically, the copper first forms a continuous layer of copper which may then be patterned (using, for example, photolithographic techniques) to create any desired pattern (e.g., lines, planes, bond pads, vias, etc.). As used herein, "metallization" collectively refers to the interconnects, conductive traces, TGVs, and other electrical pathways that direct signals and/or connect different components on substrate 4.

FIG. 1C illustrates dielectric liner 30 formed between core 10 and metallization 50 in an exemplary TGV 20 of core 10. Although dielectric liner 30 is disposed between copper metallization 50 and glass core 10 on the exposed top and bottom surfaces and on the internal walls within TGVs 20, in the description below, dielectric liner 30 in the internal walls of TGVs will be described because it is relatively harder to form liner 30 in such locations than on exposed surfaces of core 10. Moreover, although the copper-glass interfaces on the exposed top and bottom surfaces of core 10 may also be prone to delamination and other CTE mismatch induced defects, the internal walls of TGVs may be more prone to such defects and these defects may be harder to detect. Regardless, the current disclosure is equally applicable without limitation to copper-glass interfaces at all locations of the glass core 10.

Glass (the material of core 10) and copper (the material of metallization 50) have different coefficients of thermal expansions (CTEs). During temperature variations, these different materials expand and contract at different rates. This CTE mismatch can lead to the generation of thermal stresses (or CTE mismatch induced stresses) within the structure, which may result in cracking or delamination of the copper metallization from the glass core 10. In some cases, these stresses may also result in cracking of the glass core 10. Dielectric liner 30 between the glass core 10 and the copper metallization 10 may act as a buffer or a compliant layer that helps to alleviate or relieve the CTE mismatch induced stresses generated at the interface during temperature excursions or temperature cycling during processing of substrate 4 (and device 100) and during operation of device 100. In some embodiments, dielectric liner 30 may have a thickness less than about 5 microns (e.g., between about 1-5 microns).

In embodiments of the current disclosure, the material of dielectric liner 30 may be selected to alleviate the thermal stresses generated at the copper-glass interface in TGVs 20 of core 10. In general, TGVs 20 of core 10 may have a diameter between about 10-80 microns (or less than or equal to about 50 microns, in some embodiments) and an aspect ratio between about 4:1 to 25:1. The material selected for dielectric liner 30 may be such that it will readily flow into the small TGVs 50 and uniformly coat its internal walls. In some embodiments, dielectric liner 30 may be formed of a curable polymer, such as, for example, a thermosetting polymer. A curable polymer undergoes a transition from a viscous (or liquid) state to a solid state upon curing. The curing process involves the transformation of the polymer's chemical and physical structure, leading to the development of a three-dimensional network as a result of processes such as chemical crosslinking, polymerization, or other reactions that solidify the polymer. The selected curable polymer material for liner 30 may have suitable rheological properties (e.g., viscosity, wetting properties, thixotropic behavior, and surface tension) in its liquid (or viscous) phase such that it readily flows into and evenly coat the TGV walls. If the selected material is dissolved in a solvent, the solvent system may allow the polymer to flow easily and then evaporate, leaving a uniform coating.

The viscosity of a material affects its flow characteristics during application. A polymeric material with a lower viscosity may flow more readily into small TGVs. The viscosity of the material can also impact the achievable film thickness. Higher viscosity materials may result in thicker films, while lower viscosity materials may lead to thinner films. In some embodiments, the viscosity of the curable polymer used to form dielectric liner 30 may be less than 30 poise in its liquid (or viscous) phase. In some embodiments, the viscosity of the curable polymer may be less than 40 poise (or less than 50 poise in some embodiments). It is also contemplated that, in some embodiments, the viscosity of the curable polymer may be less than 120 poise (in its liquid or viscous phase). To form a uniform coating of liner 30 on the TGV walls, the selected liner material may also exhibit good wetting properties so that it can spread evenly adhere to the walls. The selected dielectric material may also exhibit thixotropic behavior. Thixotropic behavior refers to the property of a material to become less viscous under shear stress and return to a higher viscosity when at rest. A thixotropic liner material may readily flow into the TGVs 20 during the application process and maintain the desired coating thickness after application. The selected liner material may also have a suitably low surface tension to promote better wetting and spreading of the material on the walls. The selected material may also have a low density and molecular weight such that it has better flow properties.

The selected polymeric material may be such that it may be cured using a process that is suitable for, and may be readily integrated into the downstream manufacturing processes of, electronic device 100. The applied curing mechanism may be designed to allow the polymer to flow and coat the TGV walls adequately before setting. During curing, the selected curable polymer transitions from a liquid (or viscous) state to a solid (or semi solid) state and its properties change to those of a solid material. The selected material for liner 30 may be such that the cured polymer exhibits good adhesion properties to the glass walls. The selected material may also be such that, in its cured state, it exhibits good mechanical strength and properties. For example, the cured film may exhibit: a tensile strength greater than about 8 Mpa (or greater than about 5 Mpa in some embodiments); thermal stability at least at a temperature greater than about 300° C.; and dielectric loss less than about 0.002 (or less than about 0.003 or 0.004 in some embodiments). Thermal stability refers to the ability of the cured polymer material (i.e., the dielectric liner 30) to maintain its structural integrity, mechanical properties, and electrical properties when exposed to temperatures above 300° C. Electronic devices may generate heat during operation, and external factors such as high-temperature environments or manufacturing processes like soldering can expose the materials (e.g., dielectric liner 30) to elevated temperatures. If dielectric liner 30 cannot withstand these temperatures without significant degradation, it may lead to various issues such as loss of mechanical strength, changes in electrical conductivity, or even the release of volatile components. The dielectric loss factor, also known as the tangent delta (tan δ), is a measure of how much energy is lost as heat in a dielectric material when an electric field is applied. It is an indication of how well a material can withstand changes in temperature without undergoing significant chemical or physical changes. In some embodiments, the cured polymer material may also have a CTE between that of glass (e.g., between 2-6 ppm/° ° C.) and copper (e.g., ≥16.7 ppm/° C.).

In general, dielectric liner 30 may be formed of any curable polymeric material 30' having a viscosity less than 30 poise in its liquid (or uncured) state and a tensile strength greater than about 8 Mpa, thermal stability at temperatures greater than about 300° C., and dielectric loss less than about 0.002 in its cured state. In other words, the polymeric material 30' used may have a viscosity less than 30 poise in its liquid state, which upon curing, forms a solid dielectric liner 30 having a tensile strength greater than about 8 Mpa, exhibits thermal stability at temperatures greater than about 300° C., and has a dielectric loss less than about 0.002. Numerical simulations indicate that a liner 30 having the above-described properties is expected to mitigate or significantly reduce delamination at copper-glass interfaces in TGVs 20 of cores 10. Simulations also indicate that, among other curable polymeric materials, the commercially available materials listed in the table below is expected to form suitable dielectric liners 30. It should be noted that the viscosity of these materials may be varied by changing the proportion of water or another solvent in the material. For example, the polymer material may be made less viscous by adding water (or another suitable solvent) and made more viscous by removing water (or solvent).

|   | Manufacturer | Commercial name |
|---|---|---|
| 1 | Hitachi Dupont | Polyimide HD-2610 |
| 2 | Hitachi Dupont | Polyamide HD-2611 |
| 3 | Fujifilm | Durimide Series |
| 4 | Brewer Science | BSI.T1802 |
| 5 | Brewer Science | BSI.T15140G |
| 6 | Brewer Science | BSI.M17108G |

Figure 2:
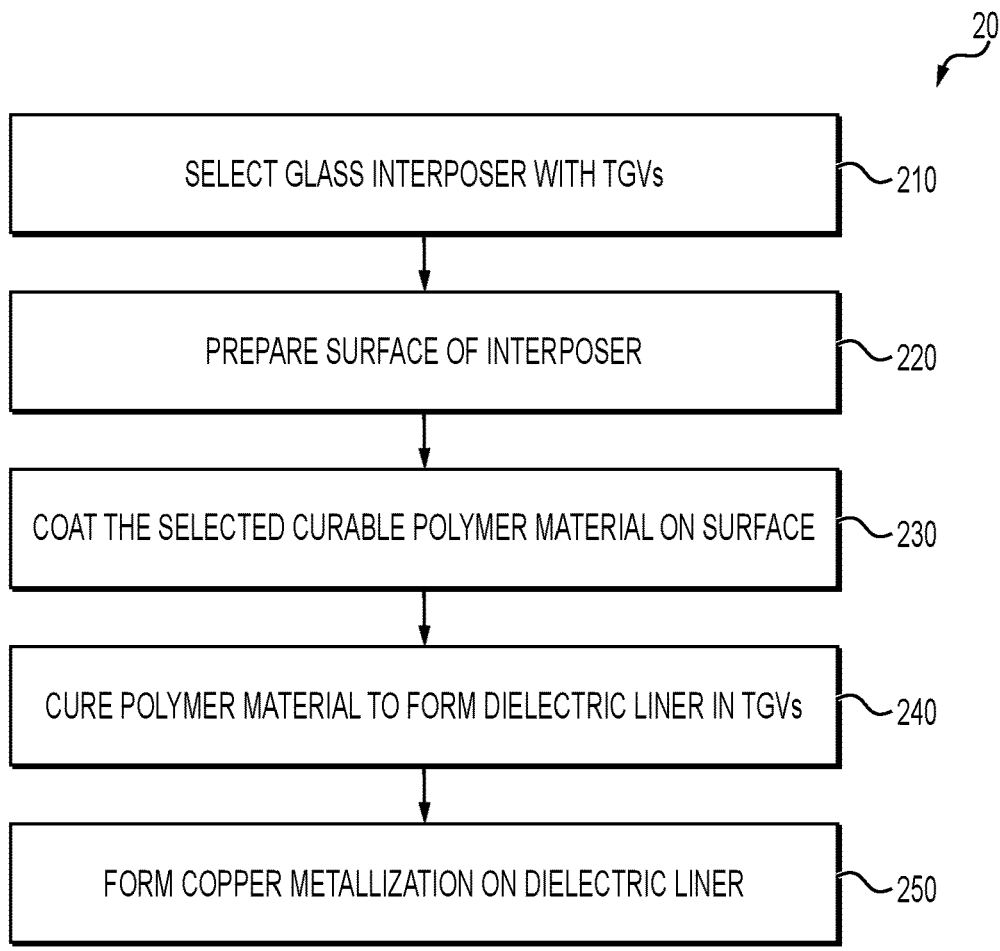
FIG. 2 is a flow chart of an exemplary method of forming the dielectric liner of FIG. 1C.

FIG. 2 illustrates a flow chart of an exemplary process 200 used form a dielectric liner 30 between the glass walls and copper metallization 50 in TGVs 20 of core 10. In step 210, a glass core 10 with TGVs 20 may be selected for processing. In some embodiments, this step may include procuring (e.g., acquiring, purchasing, etc.) glass interposers or cores 10 with pre-formed TGVs. In some embodiments, step 210 may include forming (e.g., by laser drilling, wet etching, etc.) TGVs 20 on a glass core 10. The surface (e.g., top surface) of the core 10 may then be prepared for down stream processing in step 220. The preparation of the surface may involve a series of steps to ensure good adhesion, proper cleaning, and the creation of a suitable surface for the formation of thin films thereon. In general, the glass core may be subjected to a thorough cleaning process to remove contaminants, organic residues, or particles on the surface. These cleaning processes may include one or more of ultrasonic cleaning, solvent cleaning, and plasma cleaning. In some embodiments, the glass surface may additionally or alternatively undergo a surface activation step to improve adhesion of subsequently formed layers to the glass surface. For example, the glass surface may be treated with chemicals, a plasma, or corona discharge to create reactive sites on the surface. In some embodiments, an adhesion layer (titanium (Ti), chromium (Cr), organic layers, etc.) may be deposited on the exposed surfaces of the core to improve adhesion of subsequently formed layers.

Figure 3A:
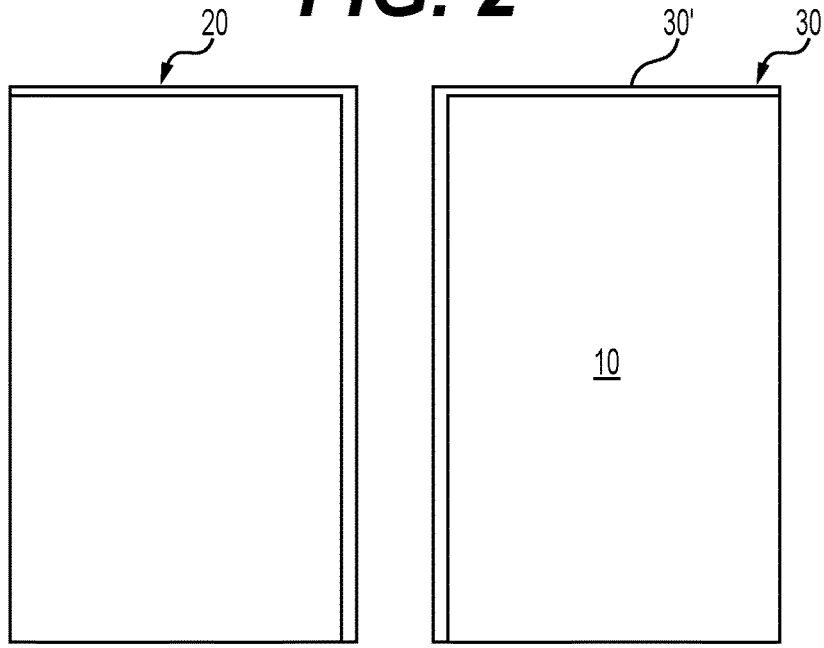
FIGS. 3A-3B are schematic illustrations of the dielectric liner on the TGV.

In step 230, the selected curable polymer material 30' (that forms dielectric liner 30 upon curing) may be coated on the surfaces of core 10. Notably, in embodiments of the current disclosure, in step 230, a layer of the selected polymer material 30' is coated on an exposed surface (e.g., the top surface) of core 10 and on the internal walls (e.g., cylindrical wall) of TGVs. 20. FIG. 3A illustrates an exemplary core 10 with its top surface and the internal walls of its TGV 20 coated with polymer material 30'. Several exemplary methods of coating the walls of TGV 20 with the selected polymer material 30' will be described later. It should be noted that, although the thickness of polymer material 30' is shown to be substantially the same on the top surface of core 10 and on the internal walls of TGV 20 in FIG. 3A, this is only exemplary. For example, in some embodiments, because of gravity, the thickness of polymer material 30' on the vertical walls of TGV 20 may be smaller than that on the top surface of core 10.

In step 240, the coated polymer material 30' may be cured to form dielectric liner 30. After curing, as also depicted in FIG. 3A, a layer of dielectric liner 30 may be formed on the top surface of core 10 and on the internal walls of TGV 20. It should also be noted that, although the thickness of polymer material 30' and dielectric liner 30 are shown to be the same in FIG. 3A, this is also only exemplary. In some embodiments, the thickness of polymer material 30' and dielectric liner 30 may be different (e.g., due to shrinkage and other mechanisms that occur as a result of curing). The applied curing process in step 240 may depend on the selected polymer material 30'. In general, the curing process may include maintaining (e.g., soaking) the coated core 10 at a selected temperature (e.g., at a temperature higher than room temperature) for a selected time. In some embodiments, the applied curing process may be a multi-step curing process (e.g., a soft cure and a hard cure, etc.). For example, the coated core may be soaked at a first temperature (>room temperature) for a first amount of time to soft cure the material. The soft cured material may then be soaked at a second temperature (>first temperature) for a second amount of time (e.g., hard curing) to complete the curing process. During curing, the coated polymer material 30' undergoes a series of chemical or physical changes that transforms the viscous polymer coating into a solid and durable dielectric liner 30 having the previously described mechanical properties (e.g., tensile strength greater than about 8 Mpa, thermal stability at temperatures greater than about 300° C., and dielectric loss less than about 0.002).

It should be noted that the composition of the polymer material 30' dispensed on core 10 may undergo changes during various stages of the manufacturing process (e.g., curing, subsequent down stream processing such as, for example, formation of metallization and build-up layers, attaching IC dies and subsequent processing and testing, etc.). The specific changes may depend on the type of polymer selected, the curing or setting process employed, and the overall manufacturing steps involved. The dispensed polymer material 30' is typically in a liquid or semi-liquid (e.g., viscous) state and may contain various additives, solvents, or reactive components depending on the specific formulation. During curing, the polymer material 30' undergoes chemical reactions and/or other curing mechanisms, and undergoes a transformation from a liquid or semi-liquid state to a solid or semi-solid state. During this process, the chemical composition may change as reactive components react to form a more stable polymer network. If the polymer formulation includes solvents to adjust viscosity or aid in processing, these solvents may evaporate during curing or post-application stages leading to further changes in its composition and properties. The temperature and duration of the curing process may also influence the final composition and properties of the polymer. Higher temperatures or longer curing times may result in more extensive cross-linking and different material properties. Thus, in some embodiments, the composition of the dispensed polymer material 30' may be different from the composition of the resulting cured dielectric liner 30 in device 100 (see FIG. 1A).

Figure 3B:
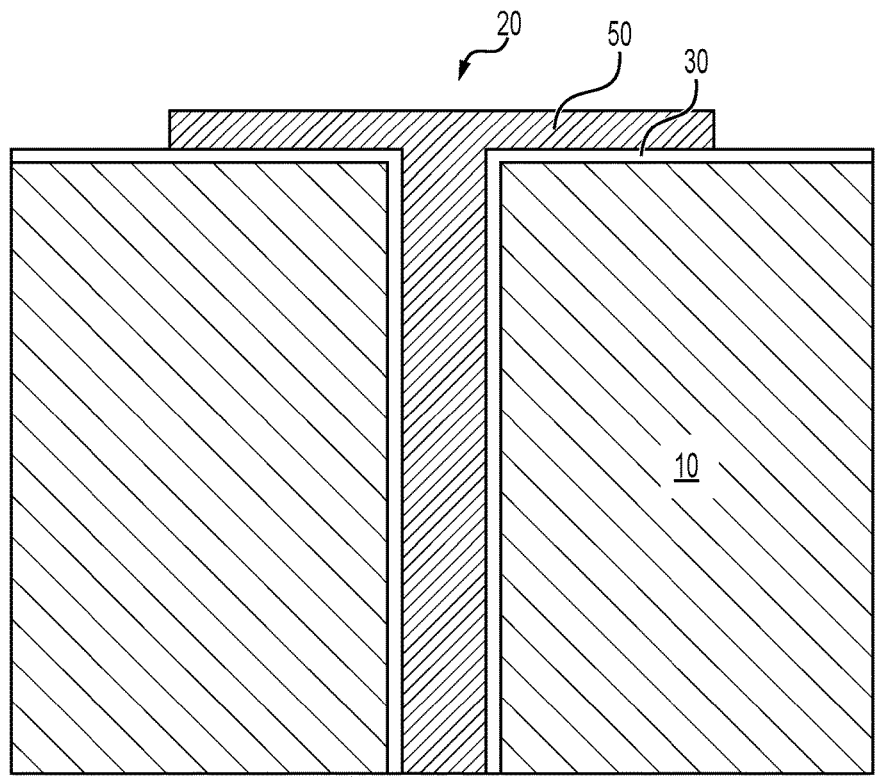

In step 250, metallization 50 may be formed on the surfaces of core 10 atop the dielectric liner 30. In this step, a copper layer may be deposited on core 10 and patterned to form metallization 50. This may involve a series of known steps to create a conductive layer for interconnections in microelectronic devices. For example, a layer of copper may be deposited using various techniques, such as, for example, physical vapor deposition (PVD), electroless process, electroplating, etc. In some embodiments, a thin copper seed layer may be first deposited before the main copper layer. The seed layer may serve as a nucleation site for the subsequent copper deposition and may help improve adhesion. In some embodiments, a thin seed layer of copper is first deposited using an electroless plating process. The main copper layer may then be deposited on the copper seed layer using an electroplating process. During the electroplating process, copper ions from a copper-containing electrolyte solution are deposited onto the seed layer, gradually filling the TGVs. This creates a continuous copper pathway from one side of core 10 to the other. In some embodiments, after the electroplating process, excess copper on the surfaces may be removed, for example, using chemical-mechanical polishing (CMP) or a wet etch process. Known photolithographic processes may then be used to pattern the deposited copper layer and form metallization 50. FIG. 3B illustrates the core 10 of FIG. 3A with metallization 50 formed on top of dielectric liner 30.

Figure 4:
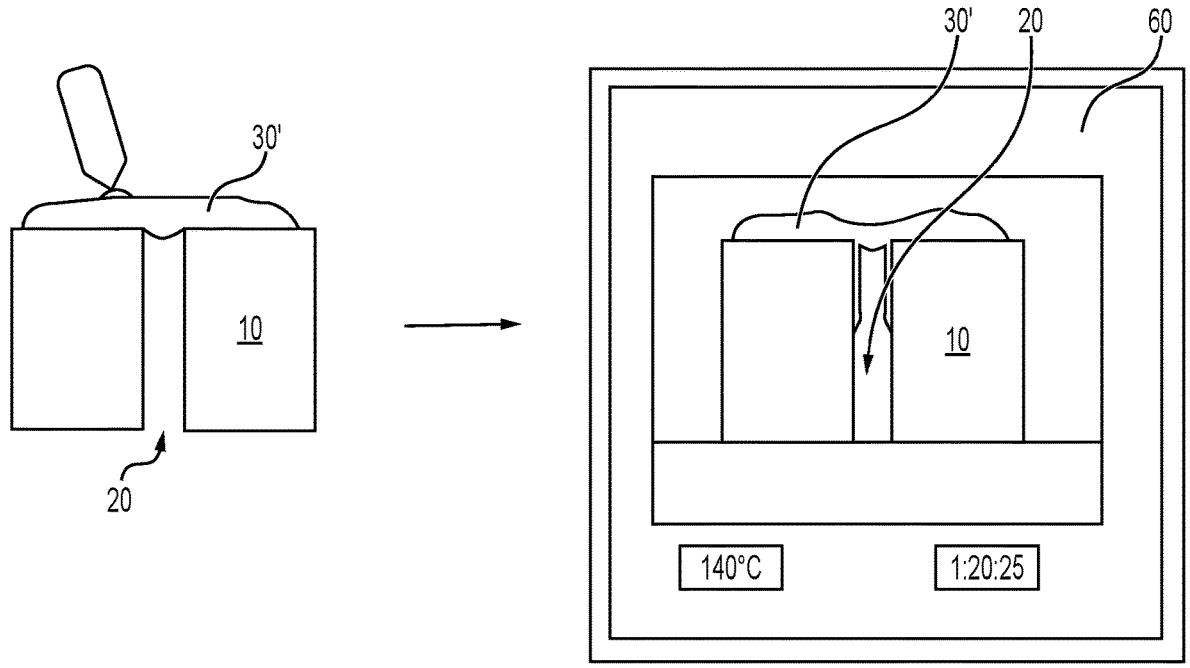
FIG. 4 illustrates an exemplary method of forming the dielectric liner on the TGV.

The curable polymer material 30' may be coated on the surface of core 10 (including the internal walls of TGVs 20) in step 230 by any suitable process. Typically, the process employed may depend on the application (e.g., the rheological properties of polymer material 30', curing process of polymer material 30', size and layout of TGVs on core 10, etc.). In some embodiments, as schematically illustrated in FIG. 4, a selected amount of the polymer material 30' may be dispensed on top of core 10 to form a pool or puddle on the surface. And, over time, the viscous polymer material 30' may flow into the TGVs 20 of core 10 and coat its walls. In general, the process of the viscous polymer material 30' flowing into TGVs 20 to coat its walls may be influenced by the rheological properties of material 30', the geometric characteristics (e.g., diameter, etc.) of TGVs 20, and the dispensing method. The rheological properties of material 30', including its viscosity and thixotropic behavior may impact how the polymer material flows under different conditions. Polymer material 30' may be dispensed onto the top surface of core 10 using a controlled dispensing system. For example, this system may include a dispenser nozzle or a syringe that precisely controls the flow and the quantity of the dispensed material 30'. Gravity and capillary action may play roles in the flow of the polymer material 30' into TGVs 20. Gravity encourages the polymer material 30' to flow downward, while capillary action draws the material 30' into the narrow spaces of the TGVs. Capillary action may be especially significant in small-diameter vias. The polymer material 30' may flow into TGVs 20 due to capillary filling which may be driven by a balance between adhesive forces that pull the material into the vias and cohesive forces within the polymer material itself. Capillary pressure may help the material 30' overcome the resistance posed by the narrow vias. In some embodiments, the dispensing process, the amount of time that the core is kept with the dispensed polymer on its top surface (e.g., residence time), the properties (e.g., viscosity, etc.) of the polymer material 30', and the ambient conditions (e.g., temperature, pressure, etc.) may be controlled and optimized to control the flow of the polymer material 30' into TGVs and form a uniform coating on its walls. This may involve varying or adjusting one or more of the above listed parameters. In some embodiments, numerical simulations may be carried out to determine the suitable properties of the polymer material 30' and the coating conditions that result in a uniform coating of the TGV walls.

In some embodiments, as illustrated in FIG. 4, in step 230, the core 10 with the polymer pool on its surface may be moved into, or kept in, an oven 60 (e.g., a curing oven) to cure the polymer material 30' as described in step 240. For example, in some embodiments of step 230, core 10 may be positioned in a rack of oven 60 when polymer material 30' is dispensed on its top surface. And in some embodiments of step 230, polymer material 30' may be dispensed on core 10 outside the oven 60, and the core with the dispensed material 30' may be moved into oven 60. In some embodiments, the temperature and/or pressure within oven 60 may be controlled to promote the flow of the viscous polymer material 30' into TGVs 20 and ensure uniform coating of its walls (of TGVs 20) with polymer material 30' (e.g., before curing begins).

In some embodiments, in step 230, the viscous polymer material 30' dispensed on the top surface of core 10 may be allowed to flow under the force of gravity into TGVs 20 to coat their internal walls. In some embodiments, above-atmospheric air pressure may be used to direct the polymer material 30 (dispensed on the top surface of core 10) into TGVs 20. For example, above-atmospheric air pressure may be applied on the top surface of core 10 to direct the viscous polymer material 30' into TGVs 20. Above-atmospheric air pressure may be applied on the top surface of core 10 in any manner. For example, air or another gas (e.g., an inert gas) under pressure may be directed into oven 60 through inlet ports positioned above core 10 to selectively increase the ambient pressure in oven 60 above core 10. As another example, a stream of high pressure air or another gas may be blown or directed to the top surface of core 10 to selectively increase the pressure on the top surface of core 10.

In some embodiments, below-atmospheric (or sub-atmospheric) air pressure may be used to direct the polymer material 30 (dispensed on the top surface of core 10) into TGVs 20. For example, the pressure in oven 60 may be decreased below atmospheric pressure to direct the viscous polymer material 30' into TGVs 20. In some embodiments, the air pressure in oven 60 below core 10 may be selectively reduced to direct the viscous polymer material 30' into TGVs 20. For example, air (or gas) from oven 60 may be exhausted or pumped out through outlets positioned below core 10 to selectively reduce the pressure below core 10. In some embodiments, the pressure in oven 60 may be reduced, for example, to a value between about 10-400 Torr to direct the flow of polymer material 30' into TGVs 20. In some embodiments, the air pressure below core 10 may be decreased such that a delta pressure between the top and bottom side of core 10 is between about 10-400 Torr to direct or promote the flow of polymer material 30' into TGVs 20.

Alternatively or additionally (to changing the pressure in oven 60 as described above), in some embodiments, during step 230, the temperature of oven 60 may be set at a value between about 50-150° C. to form a uniform coating of a desired thickness on TGV walls. In some embodiments, in step 230, the interposer with polymer material 30' dispensed thereon may be subjected to a varying temperature and/or pressure profile (e.g., a temperature and/or pressure that varies with time) in oven 60 to control the flow of polymer material 30' into TGVs 20 and form a uniform coating on its walls. For example, the rheological properties of the polymer material 30' may be such that it readily flows into the TGVs 20 at the temperature and/or pressure prevailing in the oven 60 at that time. The temperature and/or pressure in oven 60 may then be changed (e.g., based on a temperature and/or pressure profile) such that the corresponding rheological properties of material 30' creates a uniform coating of material 30' on the TGV walls. In some embodiments, numerical simulations may be performed to determine the suitable material properties (e.g., viscosity, etc.) of polymer material 30', the temperature and/or pressure conditions, and/or the residence time to enable material 30' to uniformly coat the TGV walls. The viscosity and/or other rheological properties of the selected polymer material 30' (even those listed in the table above) may be varied, for example, by changing the amount of the solvent or another additive in the material.

In some embodiments, in step 230, the curable polymer material 30' may be coated or dispensed on the surface of core 10 using a spin-on or a slot-die process. In a spin-on process, the polymer material 30' may be dispensed onto the center of a spinning core 10. The core may then be rapidly rotated or spun to spread material 30' over the entire surface through centrifugal force. As the core spins, the centrifugal force causes the polymer material 30' to spread outward. The properties of material 30', the rotation speed, and rotation time may be varied and optimized to achieve a thin and uniform coating. The slot-die coating process is a method used to deposit a thin and uniform polymer coating on core 10. The slot-die apparatus consists of a metal or ceramic manifold, known as the slot-die, positioned above core 10. The slot-die has a narrow slot or slit through which polymer material 30' flows onto the core surface. The slot-die may then be moved relative to the underlying core surface so that the polymer material covers the entire surface of the core.

Figure 5A:
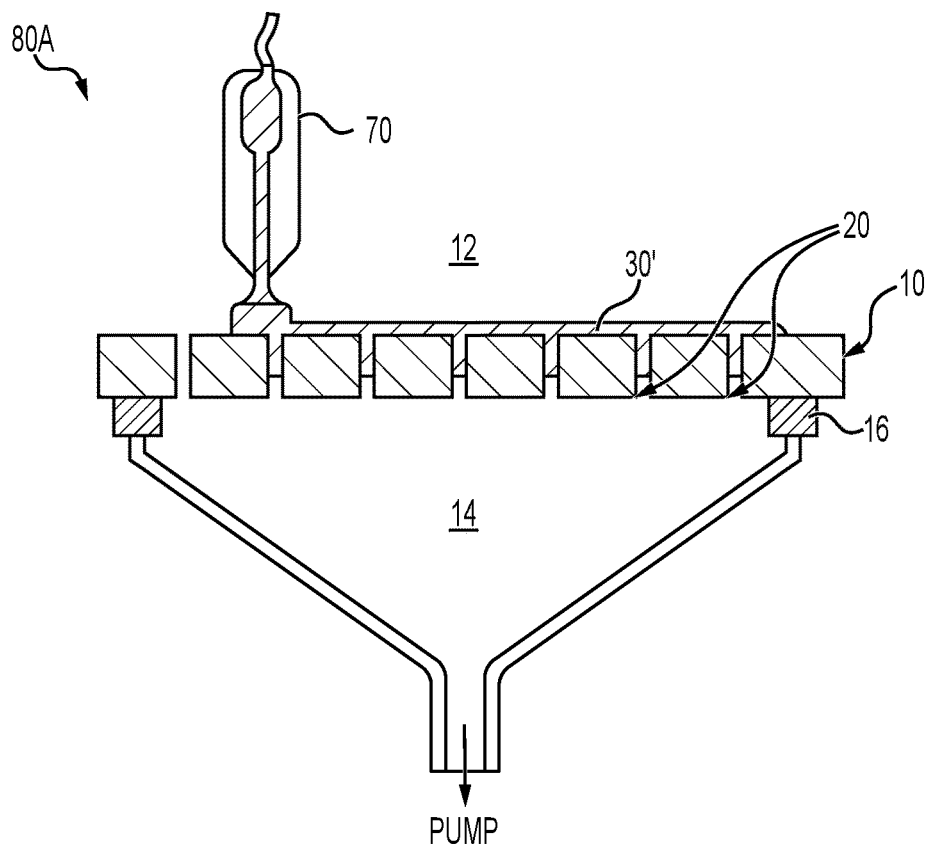
FIG. 5A is a schematic illustration of an exemplary apparatus that may be used to form the dielectric liner on a TGV.
Figure 5B:
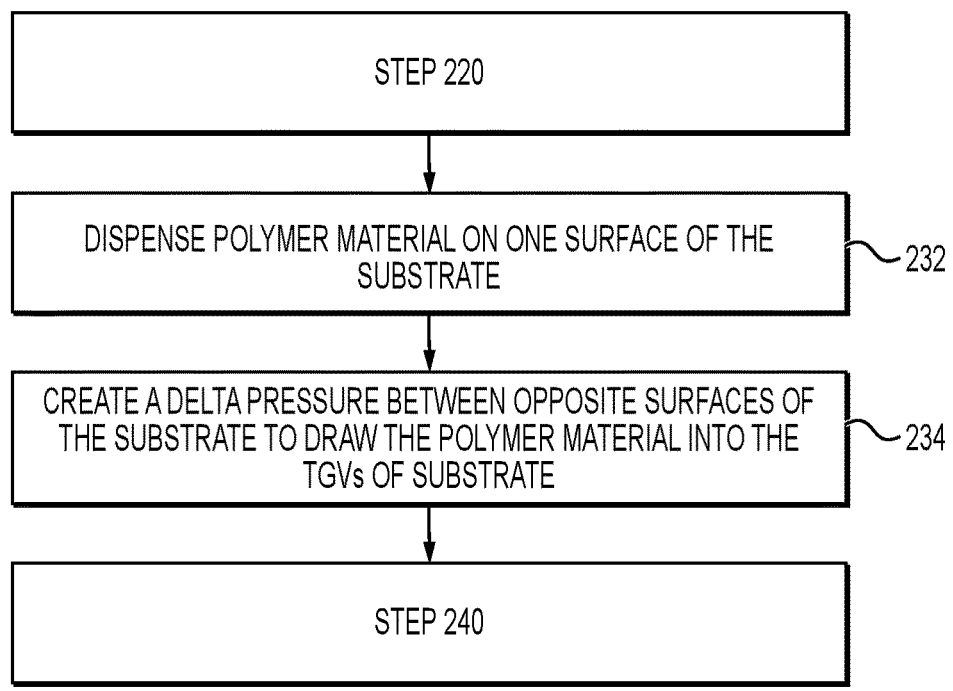
FIG. 5B is a flow chart of an exemplary method of forming the dielectric liner using the apparatus of FIG. 5A.

FIG. 5A is a schematic illustration of an exemplary apparatus 80A that may be used to coat the selected curable polymer material 30' in step 230 of process 200 (see FIG. 2). Apparatus 80A may be configured to create a pressure differential (or a delta pressure (ΔP)) between opposite sides, e.g., top, and bottom sides 12, 14 of a core 10. Core 10 with TGVs 20 may be positioned, for example, on a seal 16 (e.g., O-rings, etc.) such that the top side 12 of core 10 is fluidly isolated from the bottom side 14 of core 10. In other words, the top and bottom sides 12, 14 of core 10 may be isolated or separated by seal 16 in a manner that restricts the free flow of fluids (e.g., air) therebetween. FIG. 5B is a flow chart that shows the steps for coating the walls of TGVs 20 of core 10 using apparatus 80A in an exemplary embodiment of the current disclosure.

In the description below, reference will be made to both FIGS. 5A and 5B. In step 232, a nozzle 70 of apparatus 80A may dispense the selected polymer material 30' on the top surface of core 10 (e.g., in a manner similar to the slot-die apparatus described previously). Nozzle 70 may move with respect to the core surface to cover the underlying core surface with material 30'. In some embodiments, the height of nozzle 70 above the core surface, the speed of movement of nozzle 70, etc., may be controlled to dispense a desired quantity of material 30' uniformly on the core surface. As schematically illustrated in FIG. 5A, the back side 14 of core 10 (e.g., the environment in the back side 14) may be fluidly connected to a pump (e.g., a vacuum pump) to create a delta pressure between the back side 14 and the front side 12 of core 10 in step 234. In general, any value of delta pressure may be created in step 234. In some embodiments, a delta pressure between about 10-400 Torr may be created between the opposite sides of core 10 in step 234. Due to this pressure differential between the top and bottom sides, some of polymer material 30' dispensed on the top surface of core 10 in step 232 may be drawn into TGVs 20 of core 10 to coat its internal walls. In some embodiments, the environment in the back side 14 of core 10 may be subjected to a pressure profile (in step 234) such that the TGV walls are uniformly coated with material 30'. In some embodiments, the temperature (e.g., of core 10) may also be varied to achieve a uniform coating of the TGV walls. The coated material 30' may then be subjected to curing (in step 240) to form dielectric liner 30 on the TGV walls.

It should be noted that in some embodiments, step 234 may be performed after dispensing the material in step 232. However, this is not a requirement. For example, in some embodiments, at least some portions of steps 232 and step 234 may be performed simultaneously. After steps 232 and 234, a coating of material 30' may be formed on the top surface of core 10 and on the internal walls of its TGVs 20. After curing (e.g., in step 240), the coated material 30' may transform to form dielectric liner 30. In some embodiments, after step 234 (of FIG. 5B), core 10 positioned on seal 16 may be flipped over such that its surface upon which material 30' was previously dispensed in step 232 faces down. In other words, after dispensing material 30' on a first side of core (in step 232) and drawing some of the dispensed material 30' into TGVs 20 by applying a low pressure on the core's second side (in step 234), the core may be flipped such that the core's second side now faces up. The selected polymer material 30' may then be dispensed through nozzle 70 on the exposed second side of core 10. A delta pressure may then be created between the first and second sides (of core 10) by activating the pump to draw some of the dispensed material 30' into TGVs 20. Thereafter, the coated core may be subjected to curing in step 240. In some embodiments, the amount of material 30' dispensed on the first and second sides, the amount of time the dispensed material 30' is retained on each side, and/or the applied delta pressure may be controlled to form a desired thickness of the dielectric liner 30 on the top and bottom surfaces of core 10 and the walls of TGVs 20.

Figure 6:
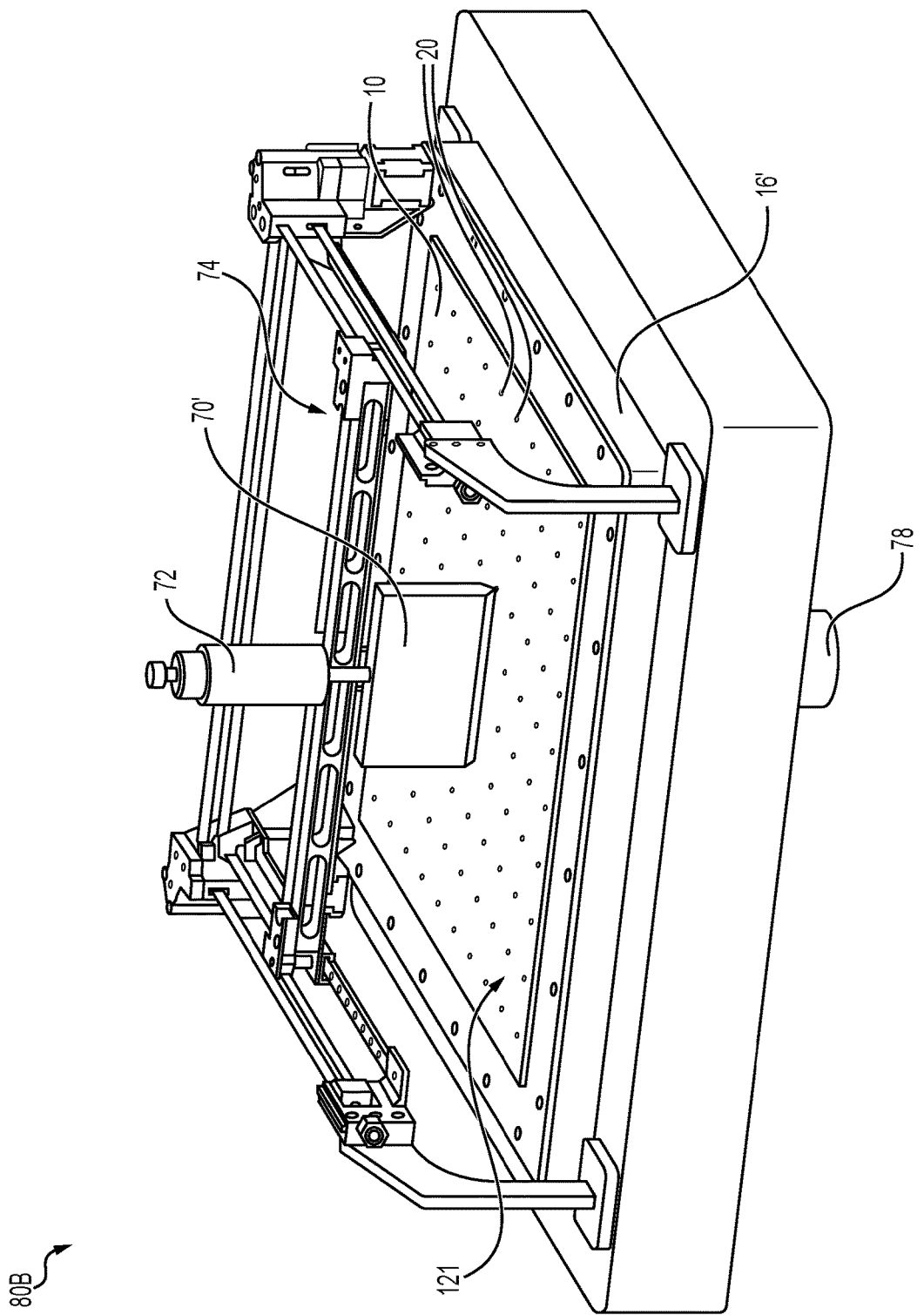
FIG. 6 illustrates another exemplary apparatus that may be used to form the dielectric liner on a TGV.

FIG. 6 illustrates another exemplary apparatus 80B that may be used to coat the selected curable polymer in step 230 of process 200 (see FIG. 2). As in apparatus 80A of FIG. 5A, in apparatus 80B of FIG. 6, a core 10 with TGVs 20 is positioned on a vacuum chuck 16' configured to apply a delta pressure between its opposite first side 12' and second side (not visible in FIG. 6). Vacuum chuck 16' may be configured to hold core 10 securely in place using vacuum pressure generated on the second side of core 10. A exhaust port 78 of apparatus 80B may be connected to a pump (e.g., vacuum pump) that is configured to decrease the pressure of the atmosphere on the second side of core 10, and thereby create a delta pressure between the first and second sides. A slot-die 70' of apparatus 80B may be supported by a motor operated gantry 74 that enables slot-die 70' to move in X and Y directions relative to core 10. A reservoir 72 fluidly connected to slot-die 70' may store the selected polymer material 30' to be dispensed on core 10. In some embodiments, a fluid line may deliver material 30' to reservoir 72 during operation of apparatus 80B.

Apparatus 80B may coat the coat the selected polymer material 30' in TGVs of core 10 using the same (or similar) process described with reference to FIG. 5B. For example, a slit-like nozzle opening of slot-die 70' may dispense the selected polymer material 30' from reservoir 72 on the first side 12' of core 10. As slot-die 70' dispenses material 30', the gantry 74 may move slot-die 70' in the X and Y directions relative to core 10 to dispense material 30' over the entire surface of core 10. In some embodiments, the height of slot-die 70' above the interposer surface, the speed of movement of slot-die 70', etc., may be controlled to dispense a desired quantity of material 30' uniformly on the interposer surface. A vacuum pump may be activated to create a delta pressure between the first and second sides of core 10. Any value of delta pressure may be applied between the first and second sides. In some embodiments, a delta pressure between about 10-400 Torr may be generated between the first and second sides. Due to this pressure differential, some of material 30' dispensed on the first side 12' of core 10 may be drawn into TGVs 20 to coat its walls. In some embodiments, the environment in the second side of core 10 may be subjected to a pressure profile (e.g., variation of pressure over time) such that the TGV walls are uniformly coated with material 30'. In some embodiments, the temperature (e.g., of core 10) may also be varied to achieve a uniform coating of the TGV walls. In some embodiments, as described with reference to apparatus 80A of FIG. 5A, after dispensing material 30' on the first side 12' and drawing some of the dispensed material 30' into TGVs 20, the core may be flipped to dispense material 30' on the second side and draw some of this dispensed material 30' into TGVs by applying a delta pressure between the first and the second sides. The amount of material 30' dispensed on the first and second sides, the amount of time the dispensed material 30' is retained (e.g., residence time) on each side, and/or the applied delta pressure may be controlled to achieve a desired coating thickness on the opposite surfaces and the TGV walls of core 10. After a uniform coating of the desired thickness is achieved, the coated material 30' may then be subjected to curing (e.g., see step 240) to form dielectric liner 30 on the surfaces and the TGV walls.

Although the current disclosure (including the disclosed processes) are described with reference to an electronic device, this is only exemplary. As would be recognized by persons skilled in the art, the current disclosure may be used in other applications also. For example, embodiments of the disclosed methods may also be used for adhesion promotion of copper-glass interfaces in other applications and devices (e.g., drug delivery, drug absorption, gas separation, lithium-ion batteries, $CO_2$ Capture, medical sensors, biological markers, wearable devices, etc.). The disclosed processes may be incorporated in any suitable process apparatus (e.g., process oven, vapor deposition systems, coating machines, etc.) Furthermore, although in the description above, some process steps were disclosed with reference to specific embodiments, a person skilled in the art would recognize that this is only exemplary, and these steps are applicable to all disclosed embodiments. Other embodiments of the disclosed methods will be apparent to those skilled in the art from consideration of the disclosure herein.

What is claimed is:

1. A method of improving interfacial adhesion of a copper-glass interface in a Through Glass Via (TGV) of an electronic device, comprising:
   providing a glass substrate with a plurality of TGVs formed thereon;
   forming a coating of a curable polymer material on an internal wall of a TGV of the plurality of TGVs, wherein a viscosity of the curable polymer material is less than 30 Poise;
   curing the coating of the curable polymer material to form a dielectric liner having a tensile strength greater than about 8 Mpa and a dielectric loss less than about 0.002; and
   depositing a layer of copper on the dielectric liner.

2. The method of claim 1, wherein forming the coating of curable polymer material includes forming a coating of one of (i) polyamide HD-2610, (ii) polyamide HD-2611, or (iii) Durimide series.

3. The method of claim 1, wherein forming the coating of a curable polymer material includes dispensing the polymer material on a surface of the substrate, and directing the dispensed polymer material into the TGV to coat the internal wall of the TGV.

4. The method of claim 3, wherein directing the dispensed polymer material into the TGV includes using gravitation force to direct the dispensed polymer material into the TGV.

5. The method of claim 3, wherein directing the dispensed polymer material into the TGV includes using above-atmospheric air pressure to direct the dispensed polymer material into the TGV.

6. The method of claim 3, wherein directing the dispensed polymer material into the TGV includes using below-atmospheric air pressure to direct the dispensed polymer material into the TGV.

7. The method of claim 6, wherein using below-atmospheric air pressure includes reducing the air pressure below the substrate relative to the air pressure above the substrate to direct the dispensed polymer material into the TGV.

8. The method of claim 7, wherein reducing the air pressure below the substrate relative to the air pressure above the substrate includes creating a pressure differential between about 10-400 Torr.

9. The method claim 1, wherein a thickness of the dielectric liner is below about 5 microns.

10. The method of claim 1, further including patterning the deposited layer of copper.

11. A method of improving interfacial adhesion of a copper-glass interface in a Through Glass Via (TGV) of an electronic device, comprising:
    providing a glass substrate with a plurality of TGVs formed thereon;
    forming a coating of a curable polymer material on a surface of the glass substrate and an internal wall of a TGV of the plurality of TGVs, wherein a viscosity of the curable polymer material is less than 30 Poise;
    curing the coating of the curable polymer material to form a dielectric iner having a tensile strength greater than about 8 Mpa; and
    depositing a layer of copper on the dielectric liner.

12. The method of claim 11, wherein forming the coating of a curable polymer material includes dispensing the polymer material on a surface of the substrate, and directing the dispensed polymer material into the TGV to coat the internal wall of the TGV.

13. The method of claim 12, wherein directing the dispensed polymer material into the TGV includes using gravitation force to direct the dispensed polymer material into the TGV.

14. The method of claim 12, wherein directing the dispensed polymer material into the TGV includes using above-atmospheric air pressure to direct the dispensed polymer material into the TGV.

15. The method of claim 12, wherein directing the dispensed polymer material into the TGV includes using below-atmospheric air pressure to direct the dispensed polymer material into the TGV.

16. The method of claim 15, wherein using below-atmospheric air pressure includes reducing the air pressure below the substrate relative to the air pressure above the substrate to direct the dispensed polymer material into the TGV.

17. The method of claim 16, wherein reducing the air pressure below the substrate relative to the air pressure above the substrate includes creating a pressure differential between about 10-400 Torr.

18. The method claim 11, wherein a thickness of the dielectric liner is below about 5 microns.

* * * * *